(12) United States Patent
Choi et al.

(10) Patent No.: US 9,746,720 B2
(45) Date of Patent: Aug. 29, 2017

(54) ARRAY SUBSTRATE, LIQUID CRYSTAL DISPLAY PANEL AND DISPLAY DEVICE

(71) Applicant: BOE TECHNOLOGY GROUP CO., LTD., Beijing (CN)

(72) Inventors: Hyun Sic Choi, Beijing (CN); Heecheol Kim, Beijing (CN); Yun Sik Im, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/435,964

(22) PCT Filed: Jul. 21, 2014

(86) PCT No.: PCT/CN2014/082571
§ 371 (c)(1),
(2) Date: Apr. 15, 2015

(87) PCT Pub. No.: WO2015/109786
PCT Pub. Date: Jul. 30, 2015

(65) Prior Publication Data
US 2016/0011467 A1    Jan. 14, 2016

(30) Foreign Application Priority Data

Jan. 27, 2014  (CN) .......................... 2014 1 0040298

(51) Int. Cl.
*H01L 29/78*  (2006.01)
*G02F 1/1343*  (2006.01)
(Continued)

(52) U.S. Cl.
CPC ...... *G02F 1/134309* (2013.01); *G02F 1/1368* (2013.01); *G02F 1/136227* (2013.01);
(Continued)

(58) Field of Classification Search
CPC .............................. H01L 27/124; H01L 29/786
See application file for complete search history.

(56) References Cited

U.S. PATENT DOCUMENTS

2006/0097265 A1    5/2006  Jeong et al.
2009/0103031 A1*   4/2009  Yamaguchi ....... G02F 1/134363
                                                                349/138
(Continued)

FOREIGN PATENT DOCUMENTS

CN    103296030 A    9/2013
CN    103499906 A    1/2014
(Continued)

OTHER PUBLICATIONS

Nov. 26, 2014—International Search Report and Written Opinion with Eng Tran.
Jan. 19, 2015—(CN)—First Office Action for Appn 201410040298.9 with Eng Tran.
Jun. 24, 2015—(CN)—Second Office Action for Appn 201410040298.9 with Eng Tran.

*Primary Examiner* — Tran Tran
(74) *Attorney, Agent, or Firm* — Banner & Witcoff, Ltd.

(57) ABSTRACT

Embodiments of the present disclosure disclose an array substrate, a liquid crystal display panel and a display device. The array substrate comprises a base substrate and a thin film transistor provided on the base substrate, and the thin film transistor comprises a gate electrode, an active layer, a source electrode and a drain electrode. The array substrate further comprises: a common electrode provided above the thin film transistor, and a first pixel electrode and a second pixel electrode both electrically connected with the drain electrode of the thin film transistor. The first pixel electrode is provided below the common electrode and is insulated from the common electrode, and the second pixel electrode is provided above the common electrode and is insulated from the common electrode.

19 Claims, 3 Drawing Sheets

(51) Int. Cl.
*G02F 1/1362* (2006.01)
*H01L 23/522* (2006.01)
*H01L 23/528* (2006.01)
*H01L 27/12* (2006.01)
*H01L 29/786* (2006.01)
*G02F 1/1368* (2006.01)

(52) U.S. Cl.
CPC ........ *H01L 23/528* (2013.01); *H01L 23/5226* (2013.01); *H01L 27/124* (2013.01); *H01L 29/786* (2013.01); *G02F 2001/13685* (2013.01); *G02F 2001/134372* (2013.01); *H01L 2924/0002* (2013.01)

(56) References Cited

U.S. PATENT DOCUMENTS

2011/0272696 A1* 11/2011 Ryu .................... H01L 27/1225
257/59
2014/0197413 A1* 7/2014 Liu ................... H01L 29/78678
257/59

FOREIGN PATENT DOCUMENTS

| CN | 203444218 U | 2/2014 |
| CN | 103777418 A | 5/2014 |
| CN | 203745775 U | 7/2014 |

* cited by examiner

ARRAY SUBSTRATE, LIQUID CRYSTAL DISPLAY PANEL AND DISPLAY DEVICE

The application is a U.S. National Phase Entry of International Application No. PCT/CN2014/082571 filed on Jul. 21, 2014, designating the United States of America and claiming priority to Chinese Patent Application No. 201410040298.9 filed on Jan. 27, 2014. The present application claims priority to and the benefit of the above-identified applications and the above-identified applications are incorporated by reference herein in their entirety.

TECHNICAL FIELD

Embodiments of the disclosure relate to an array substrate, a liquid crystal display panel and a display device.

BACKGROUND

Currently, ADvanced Super Dimension Switch (ADSDS, briefly referred to as ADS) liquid crystal display technology develops rapidly due to its advantages such as wide viewing angle, high image quality, quick response and the like.

With increase of resolution and aperture ratio of liquid crystal display panel, a pixel pitch of an ADS-type array substrate becomes smaller and smaller, which leads to a smaller and smaller storage capacitance of the ADS-type array substrate, so that capability of the ADS-type array substrate to drive liquid crystal becomes weak. Meanwhile, the smaller the storage capacitance is, the lower a retention rate of a pixel voltage is, which will further lead to other undesirable defects such as flicker, so that the image quality of the ADS-type array substrate is greatly reduced.

Figure 1:
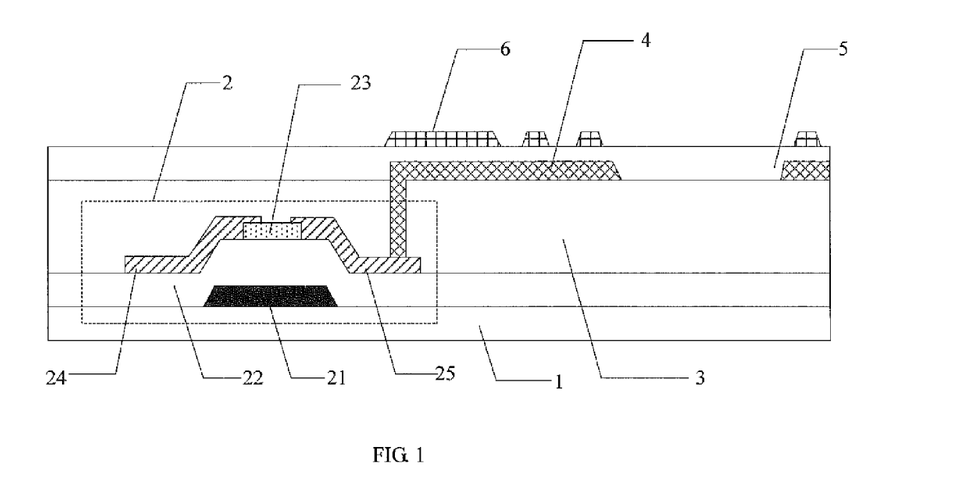
FIG. 1 is a structural schematic view illustrating a conventional array substrate.

As shown in FIG. 1, the ADS-type array substrate comprises: a base substrate 1, a thin film transistor 2, and a resin layer 3, a pixel electrode 4, an insulating layer 5 and a common electrode 6 sequentially provided above the thin film transistor 2. The thin film transistor 2 comprises: a gate electrode 21, a gate insulating layer 22, an active layer 23, a source electrode 24 and a drain electrode 25, and the source electrode 24 and the drain electrode 25 are disposed in a same layer. The pixel electrode 4 is electrically connected with the drain electrode 25 through a via hole running through the resin layer 3.

Currently, a simplest method to increase the storage capacitance of the ADS-type array substrate is to reduce a distance between the pixel electrode and the common electrode. Although this method can increase the storage capacitance of the ADS-type array substrate, yet the reduced distance between the common electrode and the pixel electrode will result in an increased probability of a short circuit between the pixel electrode and the common electrode.

SUMMARY

Embodiments of the present disclosure provide an array substrate. The array substrate comprises a base substrate and a thin film transistor provided on the base substrate, and the thin film transistor comprises a gate electrode, an active layer, a source electrode and a drain electrode. The array substrate further comprises: a common electrode provided above the thin film transistor, and a first pixel electrode and a second pixel electrode both electrically connected with the drain electrode of the thin film transistor. The first pixel electrode is provided below the common electrode and is insulated from the common electrode, and the second pixel electrode is provided above the common electrode and is insulated from the common electrode.

For example, the second pixel electrode is electrically connected with the drain electrode through the first pixel electrode.

For example, the second pixel electrode is electrically connected with the drain electrode directly.

For example, the array substrate further comprises: a first insulating layer provided between the second pixel electrode and the common electrode; and a second insulating layer provided between the common electrode and the thin film transistor. The second pixel electrode is electrically connected with the drain electrode through a via hole at least running through the first insulating layer and the second insulating layer.

For example, the first pixel electrode is partially formed on the drain electrode and directly contacts the drain electrode, so that the first pixel electrode is electrically connected with the drain electrode directly; or the drain electrode is partially formed on the first pixel electrode and directly contacts the first pixel electrode, so that the first pixel electrode is electrically connected with the drain electrode directly.

For example, the first pixel electrode is electrically connected with the drain electrode through a via hole.

For example, the thin film transistor is a thin film transistor of bottom gate type or a thin film transistor of top gate type.

For example, the first pixel electrode is of plate shape, and the second pixel electrode comprises slit electrodes.

For example, the gate electrode is provided between the base substrate and the active layer, the gate insulating layer is provided between the gate electrode and the active layer, and the source electrode and the drain electrode are both provided on the active layer; and the first pixel electrode is partially formed on the drain electrode and directly contacts the drain electrode so that the first pixel electrode is electrically connected with the drain electrode directly, and the second pixel electrode is electrically connected with the first pixel electrode through the via hole running through the first insulating layer and the second insulating layer.

For example, the gate electrode is provided between the base substrate and the active layer, the gate insulating layer is provided between the gate electrode and the active layer, and the source electrode and the drain electrode are both provided on the active layer; and the first pixel electrode is provided between the gate insulating layer and the base substrate, the first pixel electrode is electrically connected with the drain electrode through a via hole running through the gate insulating layer, and the second pixel electrode is electrically connected with the drain electrode through the via hole running through the first insulating layer and the second insulating layer.

For example, the source electrode and the drain electrode are both provided between the base substrate and the active layer, the gate electrode is provided above the active layer, and the gate insulating layer is provided between the gate electrode and the active layer; and the first pixel electrode is partially formed on the drain electrode and directly contacts the drain electrode so that the first pixel electrode is electrically connected with the drain electrode directly, and the second pixel electrode is electrically connected with the first pixel electrode through the via hole running through the first insulating layer, the second insulating layer and the gate insulating layer.

For example, the source electrode and the drain electrode are both provided between the base substrate and the active layer, the gate electrode is provided above the active layer, and the gate insulating layer is provided between the gate electrode and the active layer; and the first pixel electrode is provided between the gate insulating layer and the second insulating layer, the first pixel electrode is electrically connected with the drain electrode through a via hole running through the gate insulating layer, and the second pixel electrode is electrically connected with the first pixel electrode through the via hole running through the first insulating layer and the second insulating layer.

Embodiments of the present disclosure provide a liquid crystal display panel, and the liquid crystal display panel comprises the above-described array substrate.

Embodiments of the present disclosure provide a display device, and the display device comprises the above-described liquid crystal display panel.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DESCRIPTION OF THE EMBODIMENTS

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Sizes and shapes of respective components in the accompanying drawings do not reflect true proportions of the array substrate, but are only intended to exemplarily illustrate the embodiments of the present disclosure.

Embodiments of the present disclosure provide an array substrate. As shown in FIG. 2 to FIG. 5, the array substrate comprises a base substrate 100, and a thin film transistor 200 provided on the base substrate 100. The thin film transistor 200 comprises a gate electrode 210, an active layer 220, a source electrode 230 and a drain electrode 240. The array substrate further comprises: a common electrode 300 provided above the thin film transistor 200, and a first pixel electrode 410 and a second pixel electrode 420 both electrically connected with the drain electrode 240 of the thin film transistor 200. The first pixel electrode 410 is provided below the common electrode 300 and is insulated from the common electrode 300, and the second pixel electrode 420 is provided above the common electrode 300 and is insulated from the common electrode 300.

The above-described array substrate provided by the embodiments of the present disclosure comprises the common electrode provided above the thin film transistor, and the first pixel electrode and the second pixel electrode respectively provided above and below the common electrode and both electrically connected with the drain electrode of the thin film transistor, so storage capacitance is formed simultaneously between the first pixel electrode and the common electrode and between the second pixel electrode and the common electrode. The conventional array substrate only has one pixel electrode and one common electrode, so the storage capacitance is formed only between the one pixel electrode and the one common electrode. Accordingly, as compared with the conventional array substrate, the above-described array substrate provided by the embodiments of the present disclosure increases the storage capacitance of the array substrate, so that a retention rate of a pixel voltage of the array substrate is increased, undesirable defects of a display device (such as flicker) are reduced, and the display quality of the display device is improved.

Figure 2:
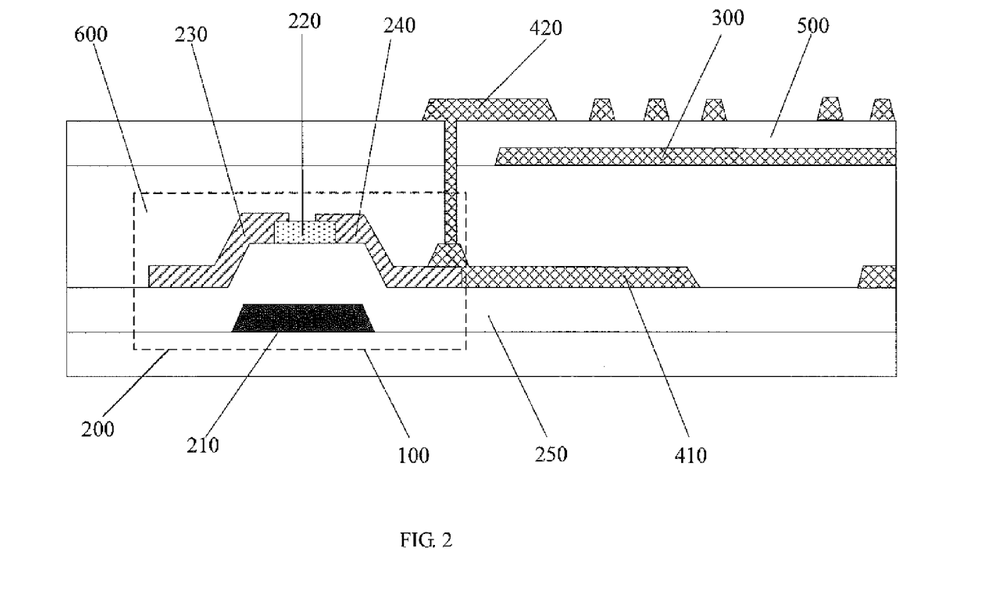
FIG. 2 is a structural schematic view illustrating an array substrate provided by Example One of embodiments of the present disclosure.
Figure 3:
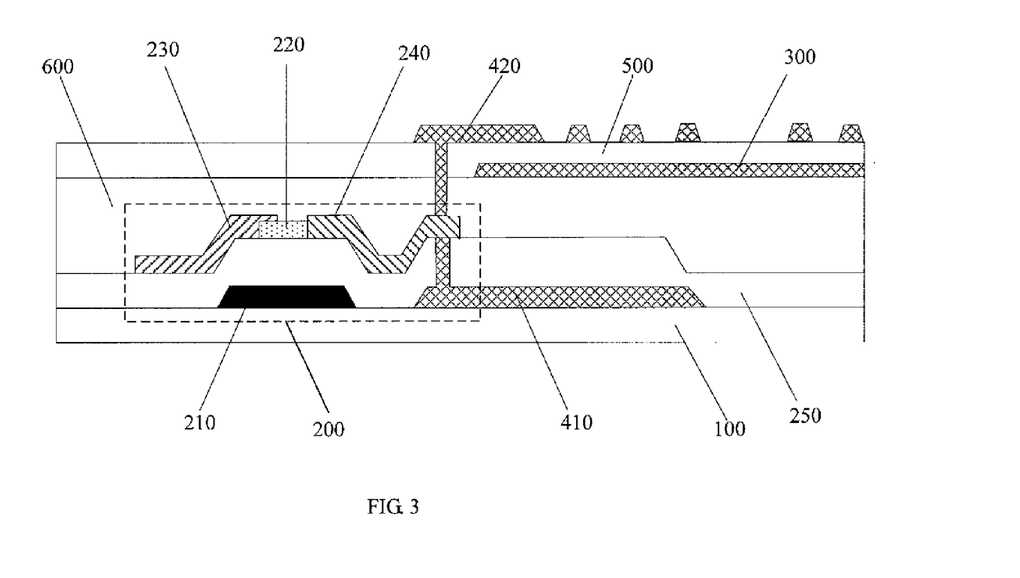
FIG. 3 is a structural schematic view illustrating the array substrate provided by Example Two of the embodiments of the present disclosure.
Figure 4:
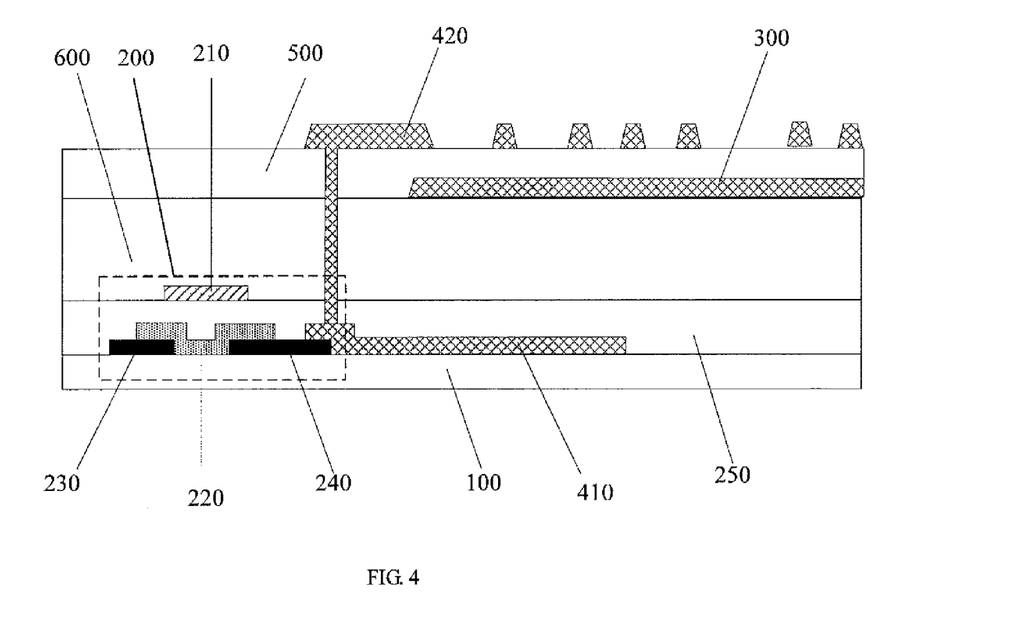
FIG. 4 is a structural schematic view illustrating the array substrate provided by Example Three of the embodiments of the present disclosure.
Figure 5:
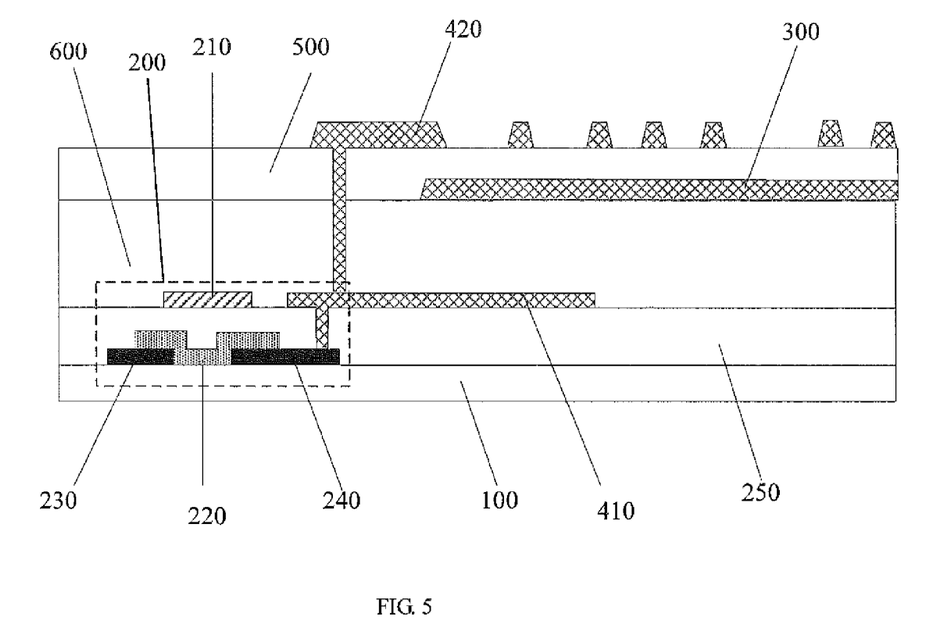
FIG. 5 is a structural schematic view illustrating the array substrate provided by Example Four of the embodiments of the present disclosure.

For example, in the above-described array substrate provided by the embodiments of the present disclosure, as shown in FIG. 2 and FIG. 3, the thin film transistor is a thin film transistor of bottom gate type; or, as shown in FIG. 4 and FIG. 5, the thin film transistor is a thin film transistor of top gate type, which will not be limited here.

For example, in the above-described array substrate provided by the embodiments of the present disclosure, the thin film transistor of bottom gate type is shown in FIG. 2 and FIG. 3. The gate electrode 210 is provided on the base substrate 100, a gate insulating layer 250 is disposed on the gate electrode 210, the active layer 220 is provided on the gate insulating layer 250, and the source electrode 230 and the drain electrode 240 are both provided on the active layer 220. Of course, the thin film transistor of bottom gate type may also have the following structures: the gate electrode is provided on the base substrate, the gate insulating layer is disposed on the gate electrode, the source electrode and the drain electrode are both provided on the gate insulating layer, and the active layer is provided on the source electrode and the drain electrode. The specific structure of the thin film transistor of bottom gate type will not be limited here.

For example, in the above-described array substrate provided by the embodiments of the present disclosure, the thin film transistor of top gate type is shown in FIG. 4 and FIG. 5. The source electrode 230 and the drain electrode 240 are both provided between the active layer 220 and the base substrate 100, the gate electrode 210 is provided above the active layer 220, and the gate insulating layer 250 is provided between the active layer 220 and the gate electrode 210. Of course, the thin film transistor of top gate type may also have the following structures: the active layer is provided on the base substrate, the gate insulating layer is provided on the active layer, the gate electrode is provided on the gate insulating layer, and the source electrode and the drain electrode are both provided above the gate electrode and are both insulated from the gate electrode. The specific structure of the thin film transistor of top gate type will not be limited here.

For example, in the above-described array substrate provided by the embodiments of the present disclosure, as shown in FIG. 2, FIG. 4 and FIG. 5, the second pixel electrode 420 is electrically connected with the drain electrode 240 through the first pixel electrode 410.

For example, in the above-described array substrate provided by the embodiments of the present disclosure, as shown in FIG. 3, the second pixel electrode 420 is electrically connected with the drain electrode 240 directly.

For example, as shown in FIG. 2 to FIG. 5, the above-described array substrate provided by the embodiments of the present disclosure further comprises: a first insulating layer 500 provided between the second pixel electrode 420 and the common electrode 300; and a second insulating layer 600 provided between the common electrode 300 and the thin film transistor 200.

The second pixel electrode 420 is electrically connected with the drain electrode 240 through a via hole at least running through the first insulating layer 500 and the second insulating layer 600.

For example, layers which the via hole electrically connecting the second pixel electrode and the drain electrode needs to run through are determined depending on the layers between the second pixel electrode and the drain electrode. As shown in FIG. 2 and FIG. 3, the first insulating layer 500 and the second insulating layer 600 are disposed between the second pixel electrode 420 and the drain electrode 240, so the second pixel electrode 420 is electrically connected with the drain electrode 240 through the via hole running through the first insulating layer 500 and the second insulating layer 600. As shown in FIG. 4, the first insulating layer 500, the second insulating layer 600 and the gate insulating layer 250 are disposed between the second pixel electrode 420 and the drain electrode 240, so the second pixel electrode 420 is electrically connected with the drain electrode 240 through the via hole running through the first insulating layer 500, the second insulating layer 600 and the gate insulating layer 250. It should be noted that, other layers may be further disposed between the second pixel electrode and the drain electrode according to actual needs, so the second pixel electrode is electrically connected with the drain electrode through the via hole running through the first insulating layer, the second insulating layer and other layers, which will not be limited here.

For example, in the above-described array substrate provided by the embodiments of the present disclosure, as shown in FIG. 2 and FIG. 4, the first pixel electrode 410 is partially formed on the drain electrode 240 and directly contacts the drain electrode 240, so that the first pixel electrode 410 is electrically connected with the drain electrode 240 directly. In this case, as compared with a case where the first pixel electrode 410 is electrically connected with the drain electrode 240 through a via hole, a fabrication process of such via hole is omitted so that a fabrication process is simplified and the fabrication cost is reduced.

For example, in order to simplify the fabrication process and reduce the fabrication cost, in the above-described array substrate provided by the embodiments of the present disclosure, the drain electrode is partially formed on the pixel electrode so that the first pixel electrode is electrically connected with the drain electrode directly.

For example, in the above-described array substrate provided by the embodiments of the present disclosure, as shown in FIG. 3 and FIG. 5, the first pixel electrode 410 is electrically connected with the drain electrode 240 through the via hole.

As shown in FIG. 3, the thin film transistor is the thin film transistor of bottom gate type, the first pixel electrode 410 is provided between the base substrate 100 and the gate insulating layer 250, and the first pixel electrode 410 is electrically connected with the drain electrode 240 through the via hole running through the gate insulating layer 250. As shown in FIG. 5, the thin film transistor is the thin film transistor of top gate type, the first pixel electrode 410 is provided between the gate insulating layer 250 and the second insulating layer 600, and the first pixel electrode 410 is electrically connected with the drain electrode 240 through the via hole running through the gate insulating layer 250. Thus, as compared with a case where the first pixel electrode 410 is electrically connected with the drain electrode 240 directly, there is an additional process for forming the via hole electrically connecting the first pixel electrode and the drain electrode; however, as compared with the prior art, an effect of increasing the storage capacitance is achieved only by adding a process of forming the first pixel electrode and a process of forming the via hole electrically connecting the first pixel electrode and the drain electrode, which do not greatly complicate the fabrication process of the array substrate.

For example, as shown in FIG. 2 to FIG. 5, in the above-described array substrate provided by the embodiments of the present disclosure, the first pixel electrode 410 is of plate shape in order to facilitate the fabrication process, and the second pixel electrode 420 comprises slit electrodes in order to improve a coordination between the second pixel electrode 420 and the common electrode 300.

Hereinafter, the above-described array substrate provided by the embodiments of the present disclosure will be described in detail with four specific examples. In the four examples described below, the array substrate comprises: the base substrate 100, the thin film transistor 200 provided on the base substrate 100, the second insulating layer 600 provided on the thin film transistor 200, the common electrode 300 provided on the second insulating layer 600, the first insulating layer 500 provided on the common electrode 300, and the second pixel electrode 420 provided on the first insulating layer 500.

EXAMPLE ONE

As shown in FIG. 2, the thin film transistor is the thin film transistor of bottom gate type. In the thin film transistor, the gate electrode 210 is provided between the base substrate 100 and the active layer 220, the gate insulating layer 250 is provided between the gate electrode 210 and the active layer 220, the source electrode 230 and the drain electrode 240 are both provided on the active layer 220, the first pixel electrode 410 is partially formed on the drain electrode 240 and directly contacts the drain electrode 240 so that the first pixel electrode 410 is electrically connected with the drain electrode 240 directly, and the second pixel electrode 420 is electrically connected with the first pixel electrode 410 through the via hole running through the first insulating layer 500 and the second insulating layer 600.

As compared with the conventional array substrate, the above-described array substrate according to Example One only needs an additional process of forming the first pixel electrode, so as to achieve the effect of increasing the storage capacitance of the array substrate while the aperture ratio of the array substrate is ensured.

EXAMPLE TWO

As shown in FIG. 3, the thin film transistor is the thin film transistor of bottom gate type. In the thin film transistor, the gate electrode 210 is provided between the base substrate 100 and the active layer 220, the gate insulating layer 250 is provided between the gate electrode 210 and the active layer 220, the source electrode 230 and the drain electrode 240 are both provided on the active layer 220, the first pixel electrode 410 is provided between the gate insulating layer 250 and the base substrate 100 and the first pixel electrode 410 is electrically connected with the drain electrode 240 through the via hole running through the gate insulating layer 250; and the second pixel electrode 420 is electrically connected with the drain electrode 240 through the via hole running through the first insulating layer 500 and the second insulating layer 600.

As compared with the array substrate according to Example One, the above-described array substrate according to Example Two needs an additional process of preparing the via hole running through the gate insulating layer 250; however, as compared with the conventional array substrate, only an additional process of preparing the first pixel electrode and an additional process of preparing the via hole running through the gate insulating layer are needed, so as to achieve the effect of increasing the storage capacitance of the array substrate while the aperture ratio of the array substrate is ensured.

EXAMPLE THREE

As shown in FIG. 4, the thin film transistor is the thin film transistor of top gate type. In the thin film transistor, the source electrode 230 and the drain electrode 240 are both provided between the base substrate 100 and the active layer 220, the gate electrode 210 is provided above the active layer 220, the gate insulating layer 250 is provided between the gate electrode 210 and the active layer 220, the first pixel electrode 410 is partially formed on the drain electrode 240 and directly contacts the drain electrode 240 so that the first pixel electrode 410 is electrically connected with the drain electrode 240 directly, and the second pixel electrode 420 is electrically connected with the first pixel electrode 410 through the via hole running through the first insulating layer 500, the second insulating layer 600 and the gate insulating layer 250.

As compared with the conventional array substrate, the above-described array substrate according to Example Three only needs an additional process of forming the first pixel electrode, so as to achieve the effect of increasing the storage capacitance of the array substrate while the aperture ratio of the array substrate is ensured.

EXAMPLE FOUR

As shown in FIG. 5, the thin film transistor is the thin film transistor of top gate type. In the thin film transistor, both the source electrode 230 and the drain electrode 240 are provided between the base substrate 100 and the active layer 220, the gate electrode 210 is provided above the active layer 220, the gate insulating layer 250 is provided between the gate electrode 210 and the active layer 220, the first pixel electrode 410 is provided between the gate insulating layer 250 and the second insulating layer 600, the first pixel electrode 410 is electrically connected with the drain electrode 240 through the via hole running through the gate insulating layer 250, and the second pixel electrode 420 is electrically connected with the first pixel electrode 410 through the via hole running through the first insulating layer 500 and the second insulating layer 600.

As compared with the array substrate according to Example Three, the above-described array substrate according to Example Four needs an additional process of preparing the via hole running through the gate insulating layer 250; however, as compared with the conventional array substrate, only an additional process of preparing the first pixel electrode and an additional process of preparing the via hole running through the gate insulating layer are needed, so as to achieve the effect of increasing the storage capacitance of the array substrate while the aperture ratio of the array substrate is ensured.

Embodiments of the present disclosure further provide a liquid crystal display panel, and the liquid crystal display panel comprises the above-described array substrate provided by the embodiments of the present disclosure.

Embodiments of the present disclosure further provide a display device, and the display device comprises the above-described liquid crystal display panel provided by the embodiments of the present disclosure. For example, the display device is a mobile phone, a tablet personal computer, a television, a display, a laptop computer, a digital photo frame, a navigator, or any other product or component having a display function. All the other essential components of the display device have been known to those ordinarily skilled in the art, which will not be repeated here and should not be a limitation to the present disclosure.

For the array substrate, the liquid crystal display panel and the display device provided by the embodiments of the present disclosure, the array substrate comprises the common electrode provided above the thin film transistor, and the first pixel electrode and the second pixel electrode respectively provided above and below the common electrode and both electrically connected with the drain electrode of the thin film transistor, so storage capacitance is fainted simultaneously between the first pixel electrode and the common electrode and between the second pixel electrode and the common electrode. The conventional array substrate only has one pixel electrode and one common electrode, so the storage capacitance is formed only between the one pixel electrode and the one common electrode. Accordingly, as compared with the conventional array substrate, the above-described array substrate provided by the embodiments of the present disclosure increases the storage capacitance of the array substrate, so that a retention rate of a pixel voltage of the array substrate is increased, undesirable defects of a display device (such as flicker) are reduced, and the display quality of the display device is improved.

The foregoing embodiments merely are exemplary embodiments of the disclosure, and not intended to define the scope of the disclosure, and the scope of the disclosure is determined by the appended claims.

The present application claims priority of Chinese Patent Application No. 201410040298.9 filed on Jan. 27, 2014, the disclosure of which is incorporated herein by reference in its entirety as part of the present application.

What is claimed is:
1. An array substrate, comprising:
  a base substrate;
  a thin film transistor provided on the base substrate, the thin film transistor comprising a gate electrode, an active layer, a source electrode and a drain electrode;
  a common electrode provided above the thin film transistor; and
  a first pixel electrode and a second pixel electrode both electrically connected with the drain electrode of the thin film transistor,
  wherein the first pixel electrode is provided below the common electrode and is insulated from the common electrode, and the second pixel electrode is provided above the common electrode and is insulated from the common electrode, and wherein the first pixel electrode and the common electrode at least partially overlap each other in a direction perpendicular to the array substrate.

2. The array substrate according to claim 1, wherein the second pixel electrode is electrically connected with the drain electrode through the first pixel electrode.

3. The array substrate according to claim 1, wherein the second pixel electrode is electrically connected with the drain electrode directly.

4. The array substrate according to claim 2, further comprising:

a first insulating layer provided between the second pixel electrode and the common electrode; and a second insulating layer provided between the common electrode and the thin film transistor, wherein the second pixel electrode is electrically connected with the drain electrode through a via hole at least running through the first insulating layer and the second insulating layer.

5. The array substrate according to claim 1, wherein the first pixel electrode is partially formed on the drain electrode and directly contacts the drain electrode, so that the first pixel electrode is electrically connected with the drain electrode directly; or the drain electrode is partially formed on the first pixel electrode and directly contacts the first pixel electrode, so that the first pixel electrode is electrically connected with the drain electrode directly.

6. The array substrate according to claim 1, wherein the first pixel electrode is electrically connected with the drain electrode through a via hole.

7. The array substrate according to claim 1, wherein the thin film transistor is a thin film transistor of bottom gate type or a thin film transistor of top gate type.

8. The array substrate according to claim 1, wherein the first pixel electrode is of plate shape, and the second pixel electrode comprises slit electrodes.

9. The array substrate according to claim 4, wherein the gate electrode is provided between the base substrate and the active layer, a gate insulating layer is provided between the gate electrode and the active layer, and the source electrode and the drain electrode are both provided on the active layer; and the first pixel electrode is partially formed on the drain electrode and directly contacts the drain electrode so that the first pixel electrode is electrically connected with the drain electrode directly, and the second pixel electrode is electrically connected with the first pixel electrode through the via hole running through the first insulating layer and the second insulating layer.

10. The array substrate according to claim 4, wherein, the gate electrode is provided between the base substrate and the active layer, a gate insulating layer is provided between the gate electrode and the active layer, and the source electrode and the drain electrode are both provided on the active layer; and the first pixel electrode is provided between the gate insulating layer and the base substrate, the first pixel electrode is electrically connected with the drain electrode through a via hole running through the gate insulating layer, and the second pixel electrode is electrically connected with the drain electrode through the via hole running through the first insulating layer and the second insulating layer.

11. The array substrate according to claim 4, wherein, the source electrode and the drain electrode are both provided between the base substrate and the active layer, the gate electrode is provided above the active layer, and a gate insulating layer is provided between the gate electrode and the active layer; and the first pixel electrode is partially formed on the drain electrode and directly contacts the drain electrode so that the first pixel electrode is electrically connected with the drain electrode directly, and the second pixel electrode is electrically connected with the first pixel electrode through the via hole running through the first insulating layer, the second insulating layer and the gate insulating layer.

12. The array substrate according to claim 4, wherein, the source electrode and the drain electrode are both provided between the base substrate and the active layer, the gate electrode is provided above the active layer, and a gate insulating layer is provided between the gate electrode and the active layer; and the first pixel electrode is provided between the gate insulating layer and the second insulating layer, the first pixel electrode is electrically connected with the drain electrode through a via hole running through the gate insulating layer, and the second pixel electrode is electrically connected with the first pixel electrode through the via hole running through the first insulating layer and the second insulating layer.

13. A liquid crystal display panel, comprising an array substrate according to claim 1.

14. A display device, comprising a liquid crystal display panel according to claim 13.

15. The array substrate according to claim 3, further comprising:

a first insulating layer provided between the second pixel electrode and the common electrode; and a second insulating layer provided between the common electrode and the thin film transistor, wherein the second pixel electrode is electrically connected with the drain electrode through a via hole at least running through the first insulating layer and the second insulating layer.

16. The array substrate according to claim 15, wherein the gate electrode is provided between the base substrate and the active layer, a gate insulating layer is provided between the gate electrode and the active layer, and the source electrode and the drain electrode are both provided on the active layer; and the first pixel electrode is partially formed on the drain electrode and directly contacts the drain electrode so that the first pixel electrode is electrically connected with the drain electrode directly, and the second pixel electrode is electrically connected with the first pixel electrode through the via hole running through the first insulating layer and the second insulating layer.

17. The array substrate according to claim 15, wherein, the gate electrode is provided between the base substrate and the active layer, a gate insulating layer is provided between the gate electrode and the active layer, and the source electrode and the drain electrode are both provided on the active layer; and the first pixel electrode is provided between the gate insulating layer and the base substrate, the first pixel electrode is electrically connected with the drain electrode through a via hole running through the gate insulating layer, and the second pixel electrode is electrically connected with the drain electrode through the via hole running through the first insulating layer and the second insulating layer.

18. The array substrate according to claim 15, wherein, the source electrode and the drain electrode are both provided between the base substrate and the active layer, the gate electrode is provided above the active layer, and a gate insulating layer is provided between the gate electrode and the active layer; and the first pixel electrode is partially formed on the drain electrode and directly contacts the drain electrode so that the first pixel electrode is electrically connected with the drain electrode directly, and the second pixel electrode is electrically connected with the first pixel electrode through the via hole running through the first insulating layer, the second insulating layer and the gate insulating layer.

19. The array substrate according to claim 15, wherein, the source electrode and the drain electrode are both provided between the base substrate and the active layer, the gate electrode is provided above the active layer, and a gate insulating layer is provided between the gate electrode and the active layer; and the first pixel electrode is provided between the gate insulating layer and the second insulating layer, the first pixel electrode is electrically connected with the drain electrode through a via hole running through the gate insulating layer, and the second pixel electrode is electrically connected with the first pixel electrode through the via hole running through the first insulating layer and the second insulating layer.

* * * * *